United States Patent
Kuo

(10) Patent No.: US 7,081,209 B2
(45) Date of Patent: Jul. 25, 2006

(54) SOLDER MASK REMOVAL METHOD

(75) Inventor: Yian-Liang Kuo, Hsin Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 317 days.

(21) Appl. No.: 10/616,156

(22) Filed: Jul. 9, 2003

(65) Prior Publication Data
US 2005/0006342 A1 Jan. 13, 2005

(51) Int. Cl.
G01L 21/30 (2006.01)
(52) U.S. Cl. ............................ 216/65; 216/13; 216/59; 219/121.61; 219/121.7
(58) Field of Classification Search .................. 216/13, 216/41, 65, 59; 219/121.61, 121.7
See application file for complete search history.

(56) References Cited

U.S. PATENT DOCUMENTS

| 5,626,774 A | | 5/1997 | Paulus ........................ 216/47 |
| 6,004,734 A | * | 12/1999 | Berg ........................... 430/502 |
| 6,346,678 B1 | | 2/2002 | Kono et al. ................. 174/255 |
| 6,756,563 B1 | * | 6/2004 | Gross et al. ............. 219/121.7 |
| 6,876,689 B1 | | 4/2005 | Walling et al. ................ 372/94 |
| 2001/0002728 A1 | * | 6/2001 | Tsukada et al. ............. 257/693 |
| 2003/0057515 A1 | * | 3/2003 | Fillion et al. ............... 257/508 |

OTHER PUBLICATIONS

VLOC (Subsidiary of II-VI Incorporated), "Yttrium Aluminum Garnet Laser Materials", before Jul. 9, 2003.
Michelle D. Shinn, High Average Power Free-Electron Lasers—A New Laser Source For Materials Processing, Thomas Jefferson National Accelerator Facility, Newport News, VA, Aug. 2000.
Circuit Technology Center, "Techniques For Removing Solder Mask", as found at mhtml:file//C:/WINNT/Temp/MXLibDir/Feature%20-%204%20Techniques%20for%20R. published 2001.

* cited by examiner

Primary Examiner—Shamim Ahmed
(74) Attorney, Agent, or Firm—Duane Morris LLP; Steve E. Koffs

(57) ABSTRACT

A printed circuit board has a circuit trace on it and a solder mask over the circuit trace. The solder mask is removed from the printed circuit board using an ultra violet laser, to expose the circuit trace without damaging the circuit trace. A failure analysis is performed on the circuit trace of the printed circuit board.

10 Claims, 3 Drawing Sheets

SOLDER MASK REMOVAL METHOD

FIELD OF THE INVENTION

The present invention relates to printed circuit board fabrication generally, and more specifically to failure analysis methods that require removal of solder masks.

BACKGROUND

A solder mask (also called "solder resist") is a coating used to protect (mask) certain areas of a printed circuit board during the soldering of connections to the circuit board. Because the solder mask covers most of the circuit board, it protects the circuitry and provides electrical insulation. Thus, only a small area of the circuit is exposed to solder. Therefore, as less solder is used, the likelihood of solder bridging over the circuit lines and other features is reduced. Also, there is less chance that contaminates will be transferred into the solder container from the circuit board. Also, the solder mask reduces dendritic growth of the copper elements on the circuit board. (The solder mask also isolates the PCB circuit traces from the external environment.)

A printed circuit board may be observed to fail during testing. Failure analysis engineers must make a determination of the reason for the failure. Because the failure may be the result of a short or open circuit in a metal trace on a layer of the printed circuit board beneath the solder mask, it may be necessary to remove the solder mask to complete the failure analysis.

A known technique for solder mask removal used by failure analysis engineers is polishing the solder mask until the defect is revealed. However, using the polishing method, it is very easy to cause artifacts and damage the circuit trace. Thus, it becomes difficult or impossible to determine whether a defect observed in the underlying circuit trace was present before the polishing, or caused by the polishing.

Other conventional techniques for solder mask removal include milling, grinding, microblasting, and chemical stripping.

Milling involves use of sharp cutters, so precision depth control is required. The milling system requires a microscope. The carbide cutters typically used are so sharp they will tend to pull into the coating and may penetrate into the board surface.

Grinding involves the use of a knife, scraper or pick by a skilled technician. No special setup is needed, but operator fatigue can be a disadvantage.

Microblasting involves propelling an abrasive material at the solder mask. The abrasive material blasts away the coating. This creates substantial friction and static charges. For circuit boards with static sensitive devices, the tool must be designed to eliminate potential ESD damage. Significant preparation time including masking is often needed. A thorough cleaning is required to flush away any blasting material from the circuit board. Operator skill and training are also required.

Chemical stripping involves application of a material like a paint stripper to the solder mask. Because the stripper is liquid, it is often hard to control. The most common chemical strippers can deteriorate the base material beneath the solder mask if exposed to the stripper for too long a time.

A failure analysis method that does not cause further damage to the underlying circuitry of the printed circuit board is desired.

SUMMARY OF THE INVENTION

A printed circuit board having a circuit trace thereon and a solder mask over the circuit trace is provided. The solder mask is removed from the printed circuit board using an ultra violet laser, to expose the circuit trace without damaging the circuit trace. A failure analysis is performed on the circuit trace of the printed circuit board.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described. These relative terms are for convenience of description and do not require that the apparatus be constructed or operated in a particular orientation.

Figure 1:
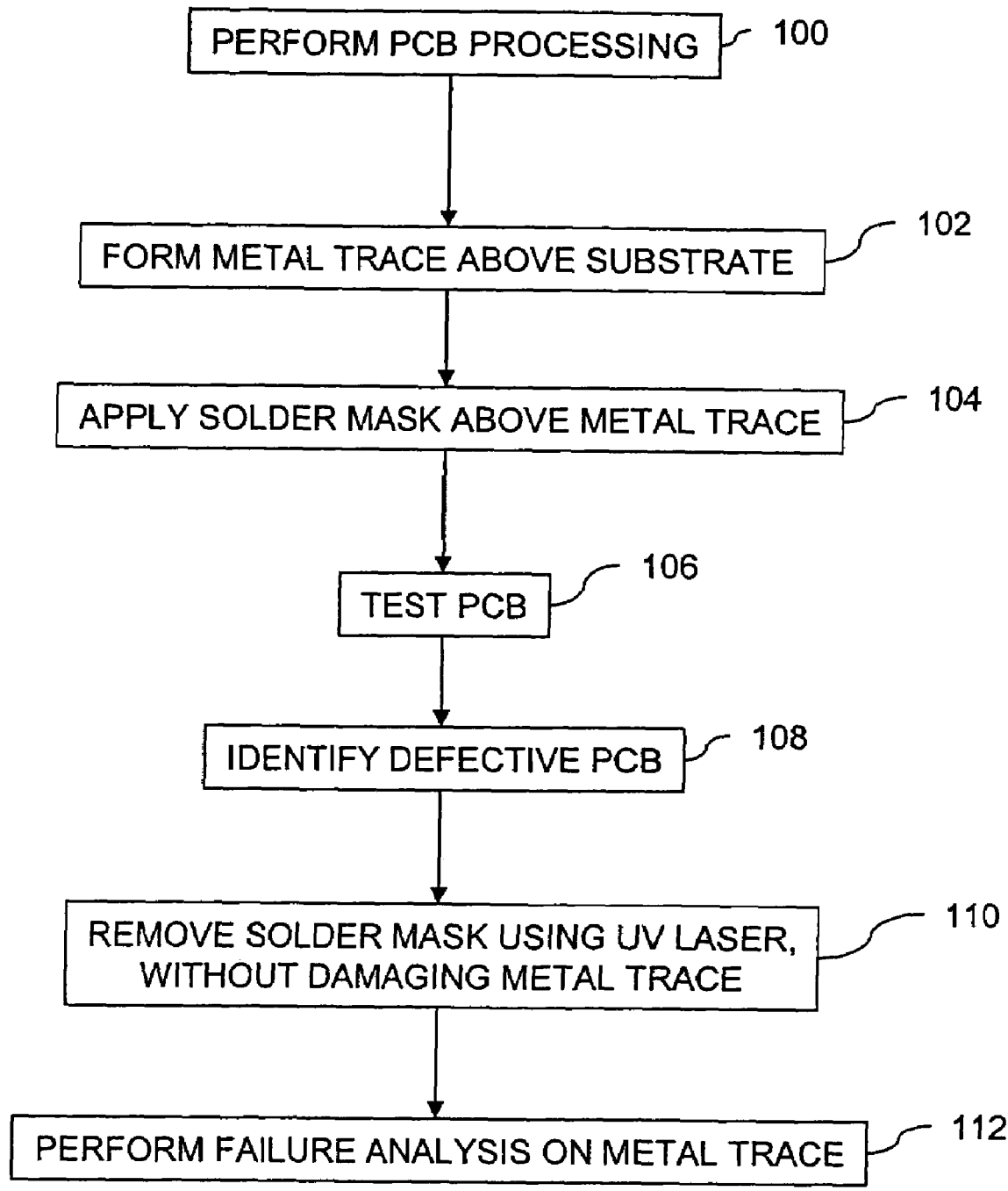
FIG. 1 is a flow chart diagram of an exemplary method according to the present invention.

FIG. 1 is a flow chart of an exemplary method according to one embodiment of the present invention.

At step 100, a printed circuit board processing operation is performed. For example, an organic core substrate of a glass-reinforced epoxy resin having a circuit trace thereon may be processed by providing an insulation layer over the circuit trace, a second circuit trace on the insulation layer, a second insulation layer on the second circuit trace, and so on. The printed circuit board may have any desired number of circuit traces, with insulation layers therebetween. The circuit traces on adjacent layers are connected using vias, which are formed in the insulation layer between the interconnected circuit traces. The printed circuit board may be, for example, a card for a personal computer, or the substrate of a ball grid array package.

At step 102, a metal circuit trace is formed on the outer surface of the outermost insulation layer, and interconnections are formed to connect to one or more of the circuit traces between the core and the outer circuit trace.

At step 104, a solder mask is applied above the circuit trace. The solder mask may be formed of a liquid or dry film type, for example. Liquid solder resist masks may be applied by screen printing or the like. The solder mask may be formed of an organic compound such as an epoxy resin. For example, the solder resist may be a thermosetting resin that is cured by heating after it is deposited. Solder resist materials having C—C, C—O, C—H and/or C—Si bonds may be used. A solder mask may be formed using the method of U.S. Pat. No. 5,626,774 or U.S. Pat. No. 6,346,678, both of which are expressly incorporated by reference herein in their entireties.

In some embodiments, the solder mask comprises a film selected from the group consisting of polyimide and cyanate ester resins and a dual solution photo-curing type material containing an unsaturated resin that includes carboxylic acid and a polyepoxy compound. The technique described herein may be applied to remove any type of solder mask.

Once the solder mask is applied, then solder balls can be applied to the printed circuit board, in the openings in the solder mask.

At step 106, the printed circuit board is tested. The tests may be of any type appropriate for the circuitry and packages included in or on the printed circuit board.

At step 108, the printed circuit board is identified as having a defect, and as being a candidate for failure analysis.

At step 110, the solder mask is removed using an ultraviolet (UV) laser, without damaging the metal circuit trace under the solder mask.

Figure 2:
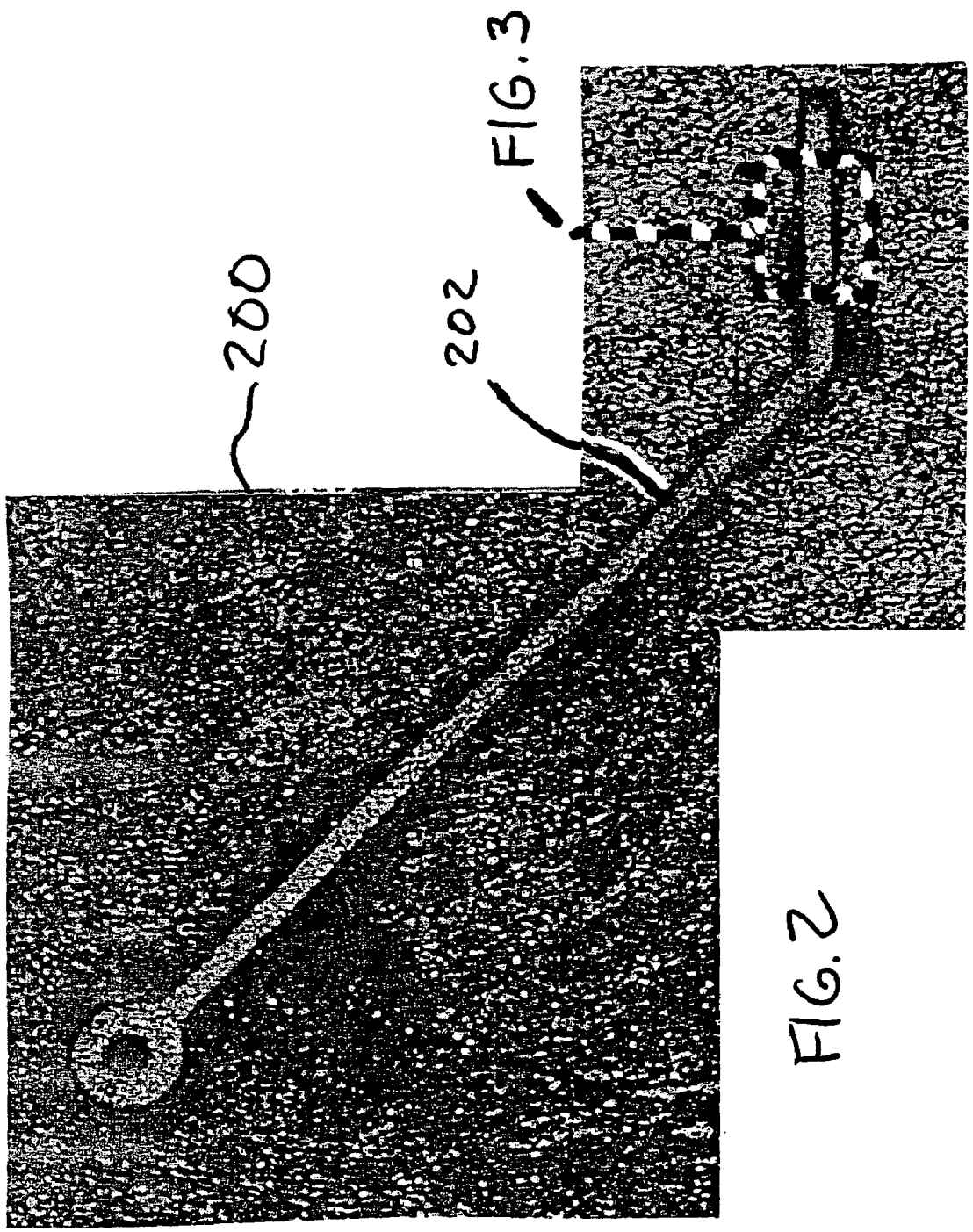
FIG. 2 is an enlarged photograph showing a metal circuit trace on a printed circuit board exposed by an exemplary method described herein.
Figure 3:
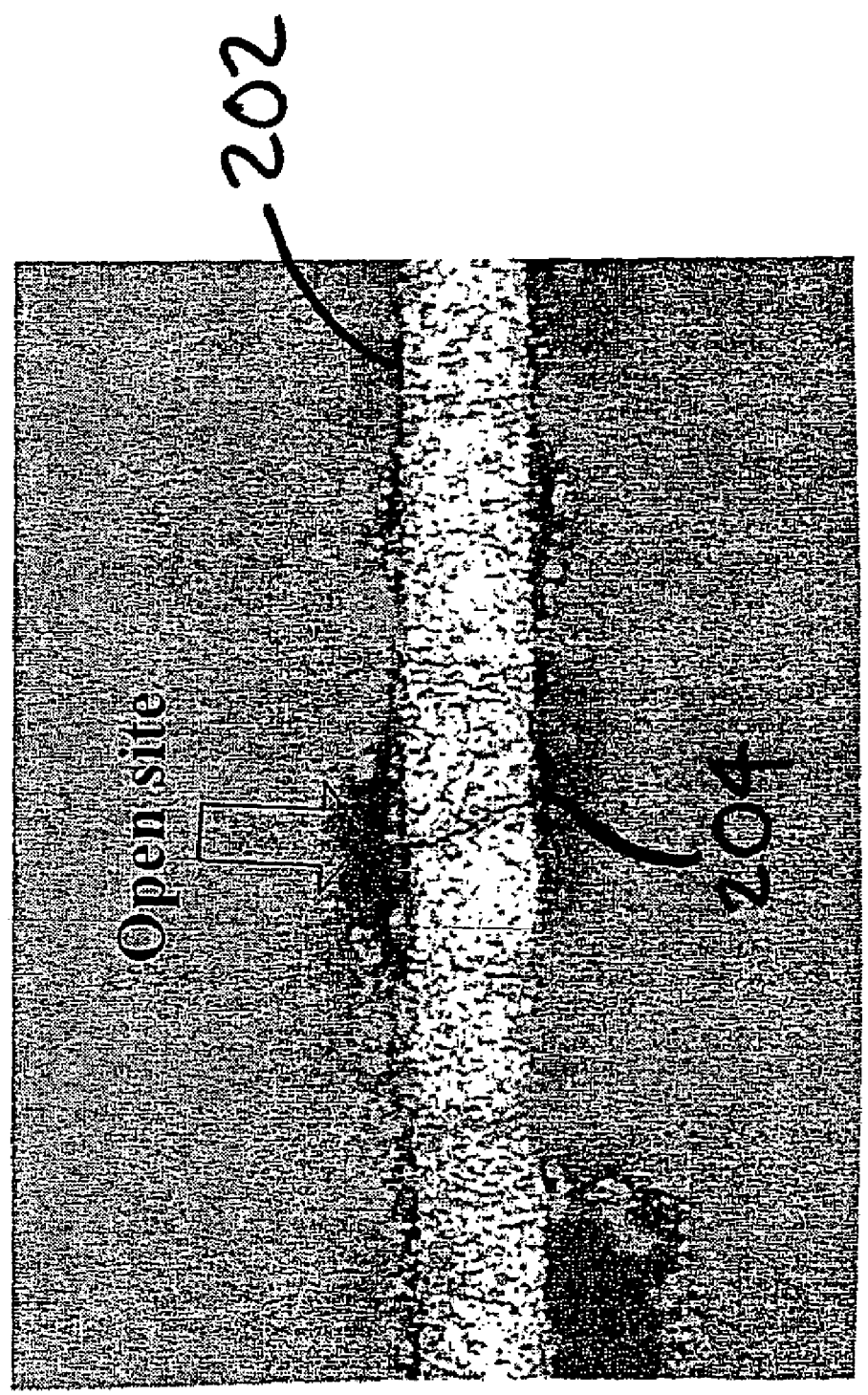
FIG. 3 is an enlarged detail of FIG. 2, showing an open circuit.

FIG. 2 shows an example of a circuit trace 202 on a printed circuit board 200, from which the solder mask has been removed. FIG. 3 is an enlarged detail of FIG. 2, showing an open circuit 204 in the circuit trace 202. The circuit trace 202 is essentially undisturbed, so that the open circuit 204 shown in FIG. 3 is clearly identifiable, and attributable to a defect that was present when the testing was failed. That is, there is no confusion as to whether the defect 204 was caused by the UV laser used to remove the solder mask.

In one example, using the laser removal technique, a 30 µm organic solder mask was removed from Part ID: TMB911, which includes a substrate sold by Kyocera, assembled by Advanced Semiconductor Engineering Inc. of Taiwan. The laser was a "New Wave Research QuikLaze", having a wavelength of 355 nm, Pulse width of 6 ns, Pulse frequency of 20 Hz, and 0.6 mJ Power using the low energy setting (and about 200 mJ at the QuikLaze setting). A 35 µm circuit trace was thus exposed.

At step 112, failure analysis is performed on the metal trace of the printed circuit board. The type of failure analysis operation depends on the nature of the defect. For example, in the circuit trace 202 shown in FIGS. 2 and 3, the defect can be detected visually. In other instances, where the defect is not readily visible, electrical testing or scanning electron microscope (SEM) inspection, or other inspection technique may be used.

UV laser light as described above can decompose organic materials with C—C, C—O, C—H and/or C—Si bonds. The ultraviolet laser may have a wavelength of from about 3 nanometers to about 400 nanometers. An exemplary ultraviolet laser is a yttrium aluminum garnet (YAG) laser having a wavelength of 355 nanometers or 266 nanometers.

There are four main laser types: Solid-state lasers, Gas lasers, Excimer lasers, and Dye lasers. Ultraviolet (UV) Radiation includes electromagnetic radiation with wavelengths between soft X rays and visible violet light, often broken down into UV-A (315–400 nm), UV-B (280–315 nm), and UV-C (100–280 nm). All the four main types of laser can produce UV laser.

(1) Solid State Laser

A solid state laser is a laser in which the active medium is in solid state (usually not including semiconductor lasers).

An example is the all solid-state Deep UV Laser source "PAL/PRO-UV™" laser system sold by Light Age, Inc. of Somerset, N.J., which produces ultra narrowband light at 248 nm, 193 mm, and Other UV wavelengths. A ruby laser was the first laser type. The ruby laser is a solid state laser which use a crystal of sapphire (aluminum oxide) containing trace amounts of chromium oxide as an active medium. A Yttrium Aluminum Garnet (YAGP) laser uses a synthetic crystal, YAG. An Nd:YAG Laser is a solid-state laser in which Neodymium doped YAG is used as a laser active medium, to produce 1064 [nm] wavelength.

Semiconductor Laser or Diode Laser

A semiconductor laser is a type of laser which produces its output from semiconductor materials such as GaAs.

(2) An excimer laser is a gas laser which emits in the UV spectrum. The active medium is an "Excited Dimer" which does not have a stable ground state. Table 1 lists wavelengths of the more common laser types

TABLE 1

| Laser Type | Media | Wave Length (s) | Nanometers |
|---|---|---|---|
| Excimer Gas Lasers | Argon Fluoride | (UV) | 193 nm |
|  | Krypton chloride | (UV) | 222 nm |
|  | Krypton Fluoride | (UV) | 248 nm |
|  | Xenon Chloride | (UV) | 308 nm |
|  | Xenon Fluoride | (UV) | 351 nm |
| Gas Lasers | Nitrogen | (UV) | 337 nm |
|  | Helium Cadmium | (UV) | 325 nm |
|  | Helium Cadmium | (Violet) | 441 nm |
| Dye Lasers | Rhodamine 6G | (VIS) | 570–650 nm |

(3) A gas laser is a laser in which the active medium is a gas. The gas can be composed of molecules (like $CO_2$), Atoms (like He—Ne), or ions (like Ar+). Table 2 lists wavelengths of several gas lasers.

TABLE 2

| Laser Type | Wavelength (nm) |
|---|---|
| Argon fluoride (UV) | 193 |
| Krypton Fluoride (UV) | 248 |
| Nitrogen (UV) | 337 |
| Argon (blue) | 488 |
| Argon (green) | 514 |
| Helium neon (green) | 543 |
| Helium neon (red) | 633 |
| Rhodamine 6G dye (tunable) | 570–650 |
| Ruby (CrAlO3) (red) | 694 |
| Nd: YAG (NIR) | 1064 |
| Carbon Dioxide (FIR) | 10600 |

(4) A dye laser is a laser using a dye solution as its active medium. Its output is a short pulse of broad spectral content and its achievable gain is high. Table 3 compares wavelengths of a frequency doubled nitrogen pumped dye laser with lasers of the other types.

TABLE 3

| Laser Type | Freq doubled Argon ion | KrF Excimer | Fourth harmonic Nd:YAG | Freq doubled $N_2$ pumped dye | New Photon Systems DUV lasers |
|---|---|---|---|---|---|
| Wavelengths, nm | 228, 234, 238, 244, 248, 257 | 248 | 266 | 200–300 tunable | 224, 248, 260, 270, 280 |

If the defect is not detected in the circuit trace immediately beneath the solder mask, following removal of the solder mask by UV laser, another type of laser can be used to remove one of the underlying layers for additional failure analysis. A green wavelength laser (such as 532 nm) can be applied to remove metal such as Cu and Al.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising the steps of:
    providing a printed circuit board having a circuit trace thereon and a solder mask over the circuit trace;
    testing the circuit trace;
    determining that the tested circuit trace contains a defect;
    removing the solder mask from the printed circuit board using an ultra violet laser after the determining step, to expose the circuit trace without damaging the circuit trace; and
    performing failure analysis on the circuit trace of the printed circuit board, thereby determining a cause of the defect.

2. The method of claim 1, wherein the ultraviolet laser has a wavelength of from about 3 nanometers to about 400 nanometers.

3. The method of claim 1, wherein the ultraviolet laser has a wavelength from the group consisting of 355 nanometers and 266 nanometers.

4. The method of claim 1, wherein the ultraviolet laser is one of the group consisting of a solid state laser, a gas laser, a dye laser, and an excimer laser.

5. The method of claim 4, wherein the ultraviolet laser is a yttrium aluminum garnet laser.

6. The method of claim 1, wherein the solder mask comprises an organic compound.

7. The method of claim 1, wherein the solder mask comprises a thermosetting resin.

8. The method of claim 7, wherein the solder mask comprises a film selected from the group consisting of polyimide and cyanate ester resins and a dual solution photo-curing type material containing an unsaturated resin that includes carboxylic acid and a polyepoxy compound.

9. The method of claim 1, wherein the failure analysis includes visually inspecting the circuit trace.

10. The method of claim 1, wherein the failure analysis includes performing a scanning electron microscope inspection of the circuit trace.

* * * * *